(12) United States Patent
Umeda et al.

(10) Patent No.: US 9,401,403 B2
(45) Date of Patent: Jul. 26, 2016

(54) NITRIDE SEMICONDUCTOR STRUCTURE

(71) Applicant: Panasonic Intellectual Property Management Co., Ltd., Osaka (JP)

(72) Inventors: Hidekazu Umeda, Osaka (JP); Masahiro Ishida, Osaka (JP); Tetsuzo Ueda, Osaka (JP); Daisuke Ueda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/636,163

(22) Filed: Mar. 2, 2015

(65) Prior Publication Data

US 2015/0171173 A1    Jun. 18, 2015

Related U.S. Application Data

(63) Continuation of application No. PCT/JP2013/004652, filed on Aug. 1, 2013.

(30) Foreign Application Priority Data

Sep. 13, 2012    (JP) ................. 2012-201433

(51) Int. Cl.
*H01L 21/02*    (2006.01)
*H01L 21/762*    (2006.01)
(Continued)

(52) U.S. Cl.
CPC .......... *H01L 29/205* (2013.01); *H01L 21/0254* (2013.01); *H01L 21/02381* (2013.01);
(Continued)

(58) Field of Classification Search
CPC ............ H01L 29/812; H01L 29/66462; H01L 29/66863; H01L 29/7786; H01L 21/187; H01L 21/02381; H01L 21/02458; H01L 21/02507; H01L 21/0254; H01L 29/36; H01L 29/86; H01L 29/155; H01L 29/2003; H01L 29/205; H01L 21/7624
See application file for complete search history.

(56) References Cited

U.S. PATENT DOCUMENTS 5,696,034 A *   12/1997  Katayama ......... H01L 29/66333
                                                148/33.1
6,188,090 B1 *   2/2001  Miyagaki .......... H01L 21/02381
                                                257/200
(Continued)

FOREIGN PATENT DOCUMENTS

JP    2003-048799    2/2003
JP    2008-251704    10/2008
(Continued)

OTHER PUBLICATIONS

International Search Report of PCT application No. PCT/JP2013/004652 dated Sep. 10, 2013.

*Primary Examiner* — Jarrett Stark
*Assistant Examiner* — Bitew Dinke
(74) *Attorney, Agent, or Firm* — McDermott Will & Emery LLP

(57) ABSTRACT

A nitride semiconductor structure of the present disclosure comprises a semiconductor substrate, and a layer formed over the semiconductor substrate and comprising plural nitride semiconductor layers. The semiconductor substrate has, from a side thereof near the layer comprising the plural nitride semiconductor layers, a surface region and an internal region in this order. The surface region has a resistivity of 0.1 Ωcm or more, and the internal region has a resistivity of 1000 Ωcm or more.

15 Claims, 6 Drawing Sheets

(51) Int. Cl.
*H01L 29/205* (2006.01)
*H01L 29/778* (2006.01)
*H01L 29/86* (2006.01)
*H01L 29/15* (2006.01)
*H01L 29/20* (2006.01)
*H01L 29/36* (2006.01)

(52) U.S. Cl.
CPC .... *H01L21/02458* (2013.01); *H01L 21/02507* (2013.01); *H01L 29/155* (2013.01); *H01L 29/2003* (2013.01); *H01L 29/36* (2013.01); *H01L 29/7786* (2013.01); *H01L 29/86* (2013.01)

(56) References Cited

U.S. PATENT DOCUMENTS

| | | | | |
|---|---|---|---|---|
| 6,544,656 | B1* | 4/2003 | Abe | C30B 15/00 117/3 |
| 7,147,711 | B2* | 12/2006 | Tamatsuka | C30B 29/06 117/13 |
| 2004/0144977 | A1* | 7/2004 | Schauer | C30B 15/206 257/56 |
| 2004/0224477 | A1* | 11/2004 | Erokhin | H01L 21/76243 438/407 |
| 2005/0250349 | A1* | 11/2005 | Sadamitsu | C30B 29/06 438/800 |
| 2006/0226412 | A1* | 10/2006 | Saxler | H01L 21/0237 257/11 |
| 2006/0226514 | A1* | 10/2006 | Jiken | H01L 21/322 257/629 |
| 2006/0263967 | A1* | 11/2006 | Falster | C30B 29/06 438/226 |
| 2008/0023706 | A1* | 1/2008 | Saito | H01L 29/7787 257/76 |
| 2009/0095973 | A1 | 4/2009 | Tanaka et al. | |
| 2009/0206324 | A1* | 8/2009 | Hudait | H01L 21/02381 257/14 |
| 2010/0053841 | A1 | 3/2010 | Rusinko, Jr. et al. | |
| 2011/0240962 | A1* | 10/2011 | Ikuta | C30B 25/18 257/15 |
| 2011/0297957 | A1* | 12/2011 | Kikkawa | H01L 21/02378 257/76 |
| 2011/0298009 | A1* | 12/2011 | Ikuta | H01L 21/02381 257/190 |
| 2012/0032229 | A1* | 2/2012 | Deai | H01L 21/02381 257/190 |
| 2012/0153440 | A1* | 6/2012 | Ikuta | H01L 29/812 257/615 |
| 2012/0168719 | A1* | 7/2012 | Ikuta | H01L 21/02381 257/15 |
| 2014/0312424 | A1* | 10/2014 | Brawley | H01L 21/2007 257/351 |

FOREIGN PATENT DOCUMENTS

| | | |
|---|---|---|
| JP | 2009-081374 | 4/2009 |
| JP | 2010-150133 | 7/2010 |
| JP | 2011-040766 | 2/2011 |
| JP | 2011-103380 | 5/2011 |
| JP | 2012-502478 | 1/2012 |
| JP | 2012-099706 | 5/2012 |
| WO | 2007/116517 | 10/2007 |

* cited by examiner

NITRIDE SEMICONDUCTOR STRUCTURE

RELATED APPLICATIONS

This application is a Continuation of International Application No. PCT/JP2013/004652, filed on Aug. 1, 2013, which in turn claims priority from Japanese Patent Application No. 2012-201433, filed on Sep. 13, 2012, the contents of all of which are incorporated herein by reference in their entireties.

TECHNICAL FIELD

The present disclosure relates to a nitride semiconductor structure applicable, for example, to a power switching element used in a power supply circuit of a consumer instrument or some other.

BACKGROUND

Group III nitride semiconductors, a typical example of which is gallium nitride (GaN), are wide-bandgap semiconductors about which, for example, gallium nitride (GaN) and aluminum nitride (AlN) have forbidden band widths of 3.4 eV and 6.2 eV, respectively, at room temperature. The group III nitride semiconductors are characterized by larger dielectric breakdown electric field and larger electron saturation velocity than gallium arsenide (GaAs) or such compound semiconductors, silicon (Si), and others.

Thus, as high frequency electronic devices or high power electronic devices, researches and developments of field effect transistors (FET) using a GaN-based compound semiconductor material have been actively made.

A nitride semiconductor material such as GaN is combined with AlN or indium nitride (InN) to give various mixed crystals. Thus, similarly to conventional arsenic-based semiconductor materials such as GaAs, the nitride semiconductor material can form a hetero junction. A hetero junction based on a nitride semiconductor, for example, an AlGaN/GaN hetero junction is characterized in that high-concentration and high-mobility carriers in its interface by spontaneous polarization and piezoelectric polarization are generated even in the state that the junction is not doped with any impurity. Thus, a transistor produced by use of the nitride semiconductor can be operated at a high speed.

Herein, AlGaN represents $Al_xGa_{1-x}N$ wherein x satisfies the relationship $0<x<1$, and InGaN represents $In_yGa_{1-y}N$ wherein y satisfies the relationship $0<y<1$. AlInN represents $Al_zIn_{1-z}N$ wherein z satisfies the relationship $0<z<1$, and InAlGaN represents $In_yAl_xGa_{1-x-y}N$ wherein x and y satisfy the relationship $0<x<1$, $0<y<1$, and $0<x+y<1$. These notations are also applicable to the following description.

For example, unexamined Japanese Patent Publication No. 2008-251704 and unexamined Japanese Patent Publication No. 2011-103380 each disclose a technique of forming a plurality of nitride semiconductor layers over a silicon substrate.

SUMMARY

The nitride semiconductor structure according to the present disclosure is a nitride semiconductor structure comprising: a semiconductor substrate, and a layer formed over the semiconductor substrate and comprising plural nitride semiconductor layers, wherein the semiconductor substrate has, from a side thereof near the layer comprising the plural nitride semiconductor layers, a surface region and an internal region in this order, and the surface region has a resistivity of 0.1 Ωcm or more, and the internal region has a resistivity of 1000 Ωcm or more.

According to the nitride semiconductor structure according to the present disclosure, a device produced using this nitride semiconductor structure can be restrained from undergoing current collapse.

DESCRIPTION OF EMBODIMENT

Problems which exemplary embodiments of this disclosure intend to solve are as follows.

When a device, such as a transistor, is produced using a nitride semiconductor layer as disclosed in unexamined Japanese Patent Publication No. 2008-251704 or unexamined Japanese Patent Publication No. 2011-103380, carriers are captured by traps existing in a surface or an inside of the transistor to cause current collapse, which is a problem that the switching property of the transistor is deteriorated. The inventors have found out that as a voltage for switching the transistor become larger, the transistor is further deteriorated about the current collapse.

The present disclosure is to restrain the current collapse of a device produced using a nitride semiconductor structure.

Hereinafter, examples of preferable exemplary embodiments for carrying out the present disclosure are described.

First Exemplary Embodiment

Figure 1:
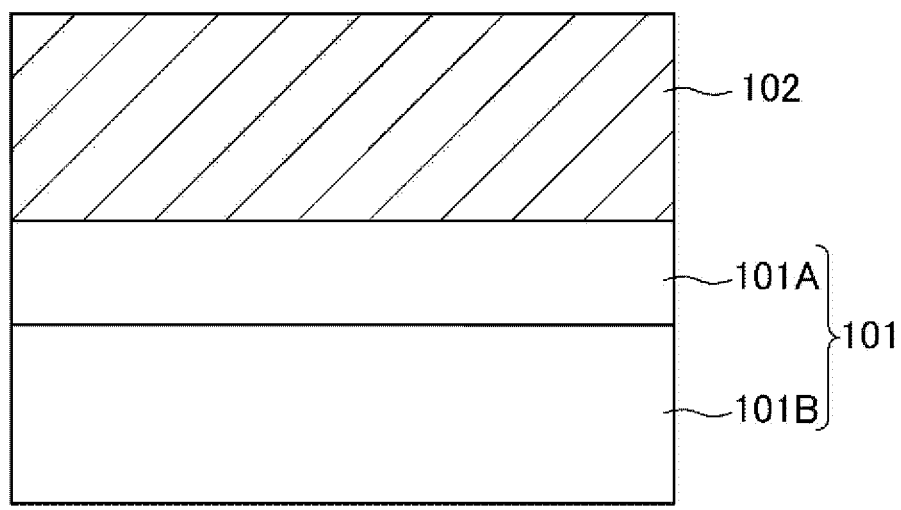
FIG. 1 is a sectional view of a nitride semiconductor structure according to a first exemplary embodiment.

FIG. 1 is a sectional view of a nitride semiconductor structure according to a first exemplary embodiment of the present disclosure. The nitride semiconductor structure according to the present exemplary embodiment makes it possible to restrain a transistor or diode produced using this nitride semiconductor structure from undergoing current collapse, and to make the produced transistor or diode have high switching property.

<Description of Basic Configuration of the Structure>

As shown in FIG. 1, the nitride semiconductor structure according to the present exemplary embodiment is composed of semiconductor substrate 101 having a resistivity of, for example, 1000 Ωcm or more, and epitaxial layer 102 formed over semiconductor substrate 101, which is made of a multi-layered film of a plurality of nitride semiconductors and has a thickness of, for example, 4 μm. The semiconductor substrate is preferably a silicon substrate. The semiconductor substrate may be an SOI (silicon on insulator) substrate or a germanium substrate. The semiconductor substrate may be a silicon substrate or a germanium substrate onto which silicon germanium (SiGe) or silicon carbide (SiC) is epitaxially grown. The thickness of epitaxial layer 102 is preferably at least 1000 nm. By making the thickness of epitaxial layer 102 large, the nitride semiconductor structure can be restrained from undergoing current collapse. When the CZ method (Czochralski method) or MCZ method (magnetic field applied Czochralski method) is used to produce a silicon substrate, the silicon substrate produced by these methods can have high oxygen concentration. For this reason, the silicon substrate can be heightened in mechanical strength. And even if the thickness of epitaxial layer 102 is over 1000 nm, the layer is not cracked. Thus, high product yield can be obtained.

Semiconductor substrate 101 has, from a side thereof near epitaxial layer 102, surface region 101A and internal region 101B in this order. It is preferred that surface region 101A has a resistivity of 0.1 Ωcm or more, and internal region 101B has a resistivity of 1000 Ωcm or more.

Epitaxial layer 102 is preferably formed using, for example, metal organic chemical vapor deposition (MOCVD). This layer may be formed using molecular beam epitaxy (MBE) or pulsed laser deposition (PLD). An initial growth layer for forming epitaxial layer 102 is preferably, for example, a nitride semiconductor layer containing a group III element. The group III element is preferably, for example, boron, aluminum, gallium, or indium. It is preferred that epitaxial layer 102 which is a multilayered film is epitaxially grown using, for example, a nitride semiconductor layer containing a group III element as the initial growth layer.

<Description of Principle>

First, a necessity of lowering the concentration of an impurity that diffuses from the initial growth layer of epitaxial layer 102 to surface region 101A is described.

In the case of using, for example, an AlN layer as the initial growth layer for forming epitaxial layer 102, the AlN layer is formed on semiconductor substrate 101, which is, for example, a silicon substrate. Consequently, Al, which is a group III element, diffuses into surface region 101A. The group III element acts as a p-type impurity for silicon, so that the resistivity of surface region 101A is changed from that of this region before epitaxial layer 102 is formed.

If a large quantity of the group III element diffuses into surface region 101A so that the resistivity of surface region 101A becomes too low, a depletion layer of semiconductor substrate 101 is formed only into a very thin region of surface region 101A. For this reason, the semiconductor substrate hardly contributes to the voltage endurance of the structure.

When the nitride semiconductor structure according to the present exemplary embodiment is used to produce a device such as a transistor or a diode, the voltage applied to the device becomes equal to the total of the voltage applied to epitaxial layer 102 and the voltage applied to semiconductor substrate 101. Therefore, when a depletion layer is formed up to deep inside of semiconductor substrate 101, the voltage applied to semiconductor substrate 101 become large, so that the voltage applied to epitaxial layer 102 is lowered. Consequently, the electric field strength inside epitaxial layer 102 can be decreased.

In the meantime, in the case of forming a depletion layer only in a very thin region of surface region 101A of semiconductor substrate 101, the electric field strength inside epitaxial layer 102 is less easily decreased than in the above-mentioned case, which is the case of forming the depletion layer up to the inside of semiconductor substrate 101. For decreasing the electric field strength inside epitaxial layer 102, it is therefore necessary to decrease the quantity of the group III element diffusing into surface region 101A (to lower the concentration of the group III element in surface region 101A), or to make the thickness of surface region 101A small, that is, to make the diffusion distance of the group III element short. The reason why it is preferred to make the diffusion distance of the group III element short is described below.

The following describes a relationship between the concentration of the impurity diffusing into surface region 101A and the resistivity of surface region 101A.

Figure 2:
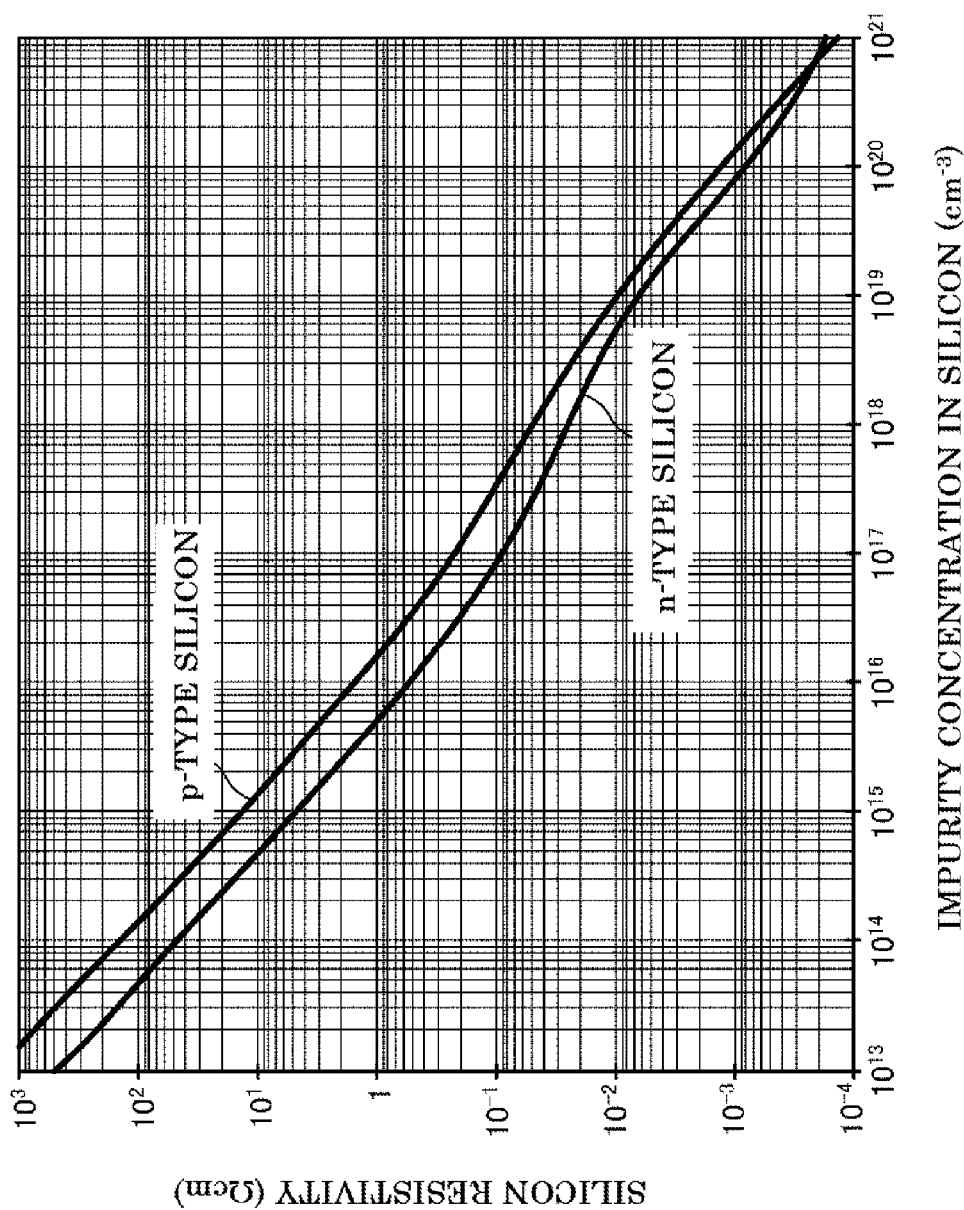
FIG. 2 is a graph showing a relationship between the concentration of an impurity in silicon and the resistivity of the silicon.
Figure 3:
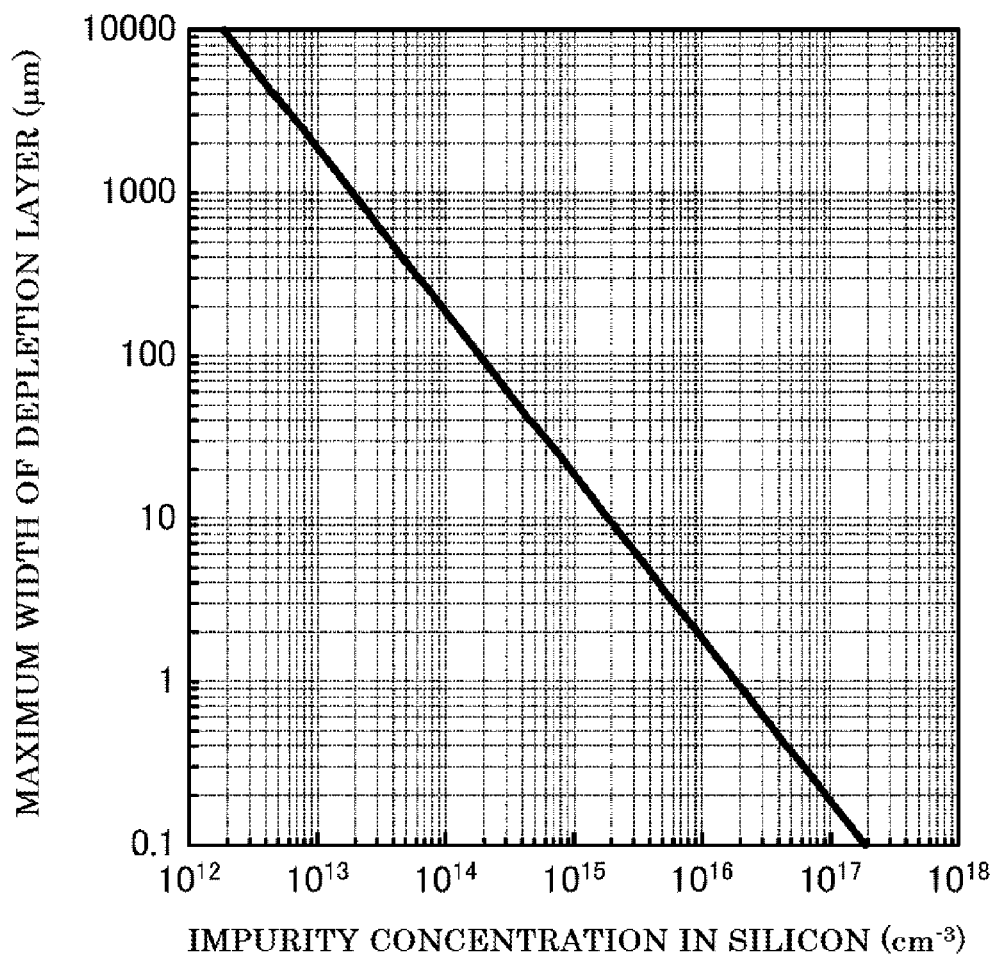
FIG. 3 is a graph showing a relationship between the concentration of an impurity in silicon and the maximum width of a depletion layer therein.

FIG. 2 shows a relationship between the concentration of an impurity in silicon and the resistivity of the silicon. FIG. 3 shows a relationship between the concentration of an impurity in silicon and the theoretical maximum width of a depletion layer therein. From FIG. 2, it is understood that when the resistivity of the p-type silicon is, for example, from 3 Ωcm to 4 Ωcm, the impurity concentration in the p-type silicon is $4 \times 10^{15}$ cm$^{-3}$. From FIG. 3, it is also understood that when the impurity concentration in the p-type silicon is $4 \times 10^{15}$ cm$^{-3}$, the maximum width of depletion layer is about 5 μm. The theoretical value of the dielectric breakdown electric field strength of silicon is about 0.3 MV/cm; thus, when the resistivity of the p-type silicon is from 3 Ωcm to 4 Ωcm, the semiconductor substrate can theoretically keep a voltage of about 150 V. As a result, the voltage applied to the inside of the epitaxial layer can be decreased by about 150 V.

An n-type silicon shown in FIG. 2 is a silicon containing phosphorus as an n-type impurity. The p-type silicon shown in FIG. 2 is a silicon containing boron as the p-type impurity. The resistivity shown in FIG. 2 is the resistivity of the silicon when the measuring temperature is 300 K. FIG. 2 is a graph extracted from a book "Physics of Semiconductor Devices" written by S. M. SZE. The relationship shown in FIG. 2 between the impurity concentration in the silicon and the resistivity of the silicon is applicable to the case using arsenic or antimony as an n-type impurity. The relationship is also applicable to the case using aluminum, gallium, or indium as a p-type impurity.

The electric field strength inside the layer can be approximately obtained by dividing a voltage applied thereto by the thickness of the layer. When the thickness of the epitaxial layer is 4 μm, the electric field strength inside epitaxial layer 102 is 150 V/4 μm=37.5 V/μm=0.375 MV/cm. Thus, the electric field strength inside epitaxial layer 102 can be decreased by 0.375 MV/cm. By restraining the diffusion distance of the group III element to 5 μm or less, a depletion layer extends also to internal region 101B, so that the depletion layer width can be adjusted to 5 μm or more. Consequently, the electric field strength inside epitaxial layer 102 can be further decreased. Hereinafter, this matter will be described in more detail. For example, the following are supposed: when the impurity concentration in a surface region of a semiconductor substrate is $4 \times 10^{15}$ cm$^{-3}$, the maximum width of depletion layer is 5 μm; and the diffusion distance of the impurity at this time can be restrained to about 2 μm. In this case, the distance from the maximum diffusion position of the impurity to the maximum depletion layer position thereof is about 3 µm. When the resistivity of the silicon becomes 1000 Ωcm in this case, the impurity concentration is about $1 \times 10^{13}$ cm$^{-3}$ for each of the p-type and n-type impurities. The impurity concentration in the internal region is 1/400 of that in the surface region, and thus the width of depletion layer in the internal region becomes about 20 times that in the surface region. Accordingly, in the internal region, the formed depletion layer comes to have a width of about 60 µm (3 µm×20). As a result, this depletion layer is combined with the depletion layer of 2 µm width in the surface region (the depletion layer based on the diffusion of the impurity), so that a depletion layer of 62 µm width comes to be formed in the semiconductor substrate. The formation of the wide depletion layer makes it possible to ensure voltage of the semiconductor substrate. It is therefore necessary to control the diffusion distance of the impurity into a distance shorter than the maximum width of depletion layer obtained by the impurity concentration. In short, it is preferred to make the diffusion distance of the impurity short.

<Description of Resistivity of Surface Region>

On the basis of the above description, the following will state how the resistivity of the surface region is preferably set.

Figure 9:
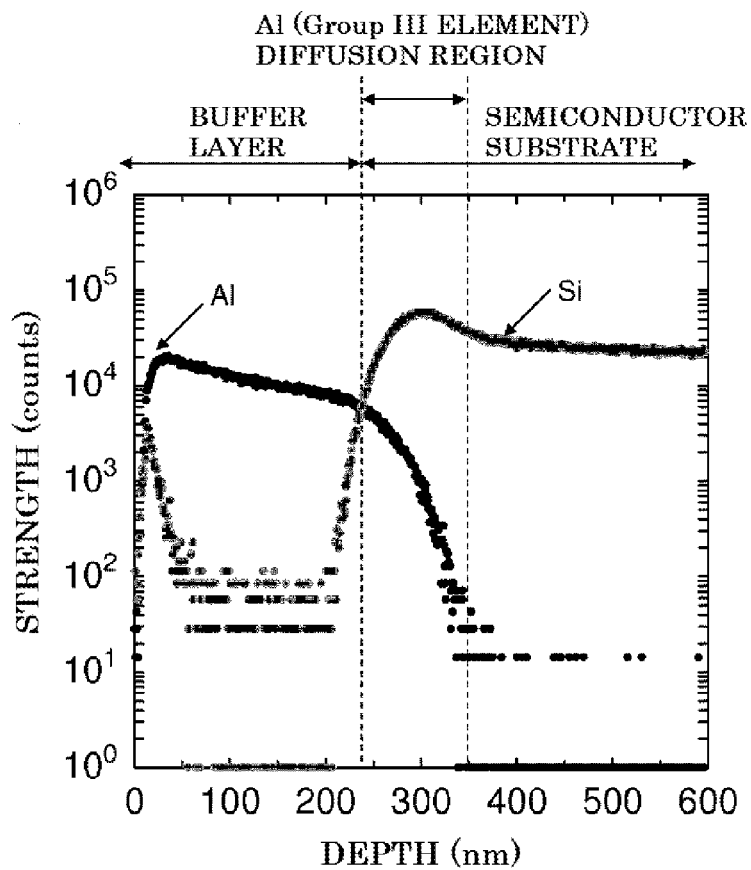
FIG. 9 is a graph showing analysis results of elements that are present in the vicinity of an interface between a semiconductor substrate and a buffer layer.

As shown in FIG. 3, as the impurity concentration, that is, the diffusion quantity of the group III element is made lower, the width of depletion layer increases. Thus, the electric field strength inside epitaxial layer 102 can be effectively decreased. Specifically, it is desired to set the resistivity of surface region 101A to 0.1 Ωcm or more and set the resistivity of internal region 101B to 1000 Ωcm or more. A detailed description will be made hereinafter about the reason why the resistivity of surface region 101A is set to 0.1 Ωcm or more. FIG. 9 shows analysis results of elements present in the vicinity of an interface between a semiconductor substrate and a buffer layer. Experimental conditions for results in FIG. 9, and others are described in item <Description of Transistor Structure>. As shown in the experimental results in FIG. 9, the diffusion distance of an impurity therein is about 100 nm. As described above, therefore, the maximum width of depletion layer obtained from the impurity concentration should be preferably made longer than the diffusion distance of the impurity; thus, it is preferred to set the maximum width of depletion layer to 100 nm or more. As shown in FIG. 3, in order to set the maximum width of depletion layer to 100 nm or more, it is indispensable to set the impurity concentration in the surface region to $2 \times 10^{17}$ cm$^{-3}$ or less. As shown in FIG. 2, when the impurity concentration in the surface region is $2 \times 10^{17}$ cm$^{-3}$, the resistivity of the surface region is 0.1 Ωcm. It is therefore preferred that the resistivity of surface region 101A is 0.1 Ωcm or more. Conversely, it is not preferred that the resistivity of surface region 101A is less than 0.1 Ωcm. The above has described the reason why the lower limit of the resistivity of surface region 101A is set to 0.1 Ωcm when silicon is used for the semiconductor substrate. Also in the case of using, for the semiconductor substrate, for example, germanium, it is preferred to set the lower limit of the resistivity of surface region 101A to 0.1 Ωcm.

Inside semiconductor substrate 101, the group III element acts as a p-type impurity. Thus, a relationship between the resistivity of surface region 101A and that of internal region 101B is varied in accordance with whether the conduction type of semiconductor substrate 101 is a p-type, an n-type or an undoped type. Hereinafter, a reason therefor will be described.

When the conduction type of semiconductor substrate 101 is a p-type, surface region 101A into which the group III element diffuses is higher in concentration of holes than internal region 101B, so that surface region 101A is lower in resistivity than internal region 101B.

When the conduction type of semiconductor substrate 101 is an n-type, the group III element acts to decrease electrons inside semiconductor substrate 101. Thus, the resistivity of surface region 101A is once made higher than that of internal region 101B. Subsequently, when the diffusion quantity of the group III element into surface region 101A increases, the conduction type of internal region 101B is changed to a p-type. Thus, the concentration of holes in this region is increased. Consequently, surface region 101A becomes lower in resistivity than internal region 101B.

When semiconductor substrate 101 is undoped, the resistivity of surface region 101A is made lower than that of internal region 101B by the diffusion of the group III element.

<Description of Other Characteristics>

As described above, it is necessary to lower the concentration of the impurity which diffuses from the initial growth layer of epitaxial layer 102 to surface region 101A. It is therefore desired that the group III element is contained in surface region 101A and the concentration of the group III element is set to $1 \times 10^{18}$ cm$^{-3}$ or less. It is also desired that the group III element is contained in internal region 101B and the concentration of the group III element is set to $1 \times 10^{15}$ cm$^{-3}$ or less.

The thickness of surface region 101A is desirably 10 µm or less. As the thickness of surface region 101A is smaller, a more preferred result is obtained. Surface region 101A contains the group III element; thus, as the thickness of surface region 101A is smaller, a depletion layer is more easily formed in surface region 101A and internal region 101B to enhance the effect of decreasing the electric field strength inside epitaxial layer 102. On the other hand, if the thickness of surface region 101A is made larger than 10 µm, it become difficult to gain the effect of decreasing the electric field strength inside epitaxial layer 102.

It is also desired that the concentration of oxygen contained inside semiconductor substrate 101 ranges from $1 \times 10^{17}$ cm$^{-3}$ to $5 \times 10^{18}$ cm$^{-3}$. This manner makes it possible to heighten the mechanical strength of semiconductor substrate 101, so that the thickness of epitaxial layer 102 can be made large. Thus, the electric field strength inside epitaxial layer 102 can be decreased.

As described above, a device, such as a transistor or diode, produced by using the nitride semiconductor structure according to the present exemplary embodiment makes it possible to be restrained from undergoing current collapse and be improved in switching property.

First Modified Example of First Exemplary Embodiment

A nitride semiconductor structure according to the present modified example is different from the first exemplary embodiment in oxygen concentration distribution in semiconductor substrate 101. Specifically, in the nitride semiconductor structure according to the present modified example, surface region 101A of semiconductor substrate 101 in FIG. 1 is structured to be lower in oxygen concentration than internal region 101B (the structure is not illustrated). This structure makes surface region 101A lower in mechanical strength than internal region 101B. This manner makes it possible that surface region 101A absorbs strains caused by lattice mismatching generated when epitaxial layer 102 is formed. The oxygen concentration in internal region 101B ranges preferably from $1 \times 10^{17}$ cm$^{-3}$ to $5 \times 10^{18}$ cm$^{-3}$. It is sufficient that the oxygen concentration in surface region 101A is lower than that in internal region 101B.

Second Modified Example of First Exemplary Embodiment

Figure 4:
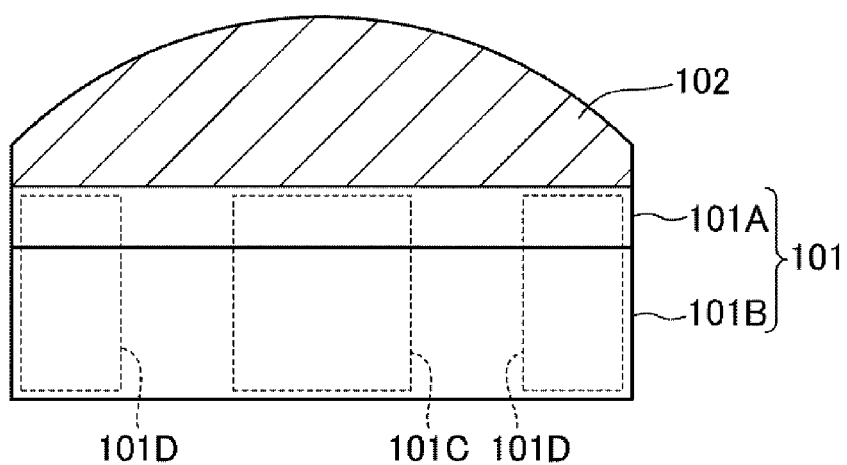
FIG. 4 is a sectional view of a nitride semiconductor structure according to a first modified example of the first exemplary embodiment.

FIG. 4 is a sectional view of a nitride semiconductor structure according to a second modified example of the first exemplary embodiment.

The nitride semiconductor structure according to the present modified example is different from the first exemplary embodiment not only in oxygen concentration distribution in semiconductor substrate 101 but also in thickness distribution of epitaxial layer 102. Specifically, it is preferred that the oxygen concentration of a central portion of semiconductor substrate 101 is higher than that of an end of semiconductor substrate 101. More specifically, as shown in FIG. 4, high-oxygen-concentration region 101C and low-oxygen-concentration region 101D are located inside semiconductor substrate 101. When this structure is viewed in plan, it is preferred that low-oxygen-concentration region 101D is formed to surround high-oxygen-concentration region 101C. It is also preferred that epitaxial layer 102 is formed to be thick at the central portion and to be thin at the end portion (or to have a convex-form thickness distribution). Even more specifically, this structure is shown in FIG. 4.

The above-mentioned structure makes the central portion of semiconductor substrate 101 higher in mechanical strength than the end portion of semiconductor substrate 101. As shown in FIG. 4, therefore, there is an effect that at the time of forming epitaxial layer 102, which has a thick central portion and a thin end portion (or has a convex-form thickness distribution), the present nitride semiconductor structure can be restrained from being warped or cracked. Accordingly, in epitaxial layer 102 in which the central portion is thick and the end portion is thin, an oxygen distribution as described above is particularly desired.

As described above, a device, such as a transistor or diode, produced by using the nitride semiconductor structure of the present modified example can be improved in switching property. Additionally, the product yield can be heightened.

Third Modified Example of First Exemplary Embodiment

Figure 5:
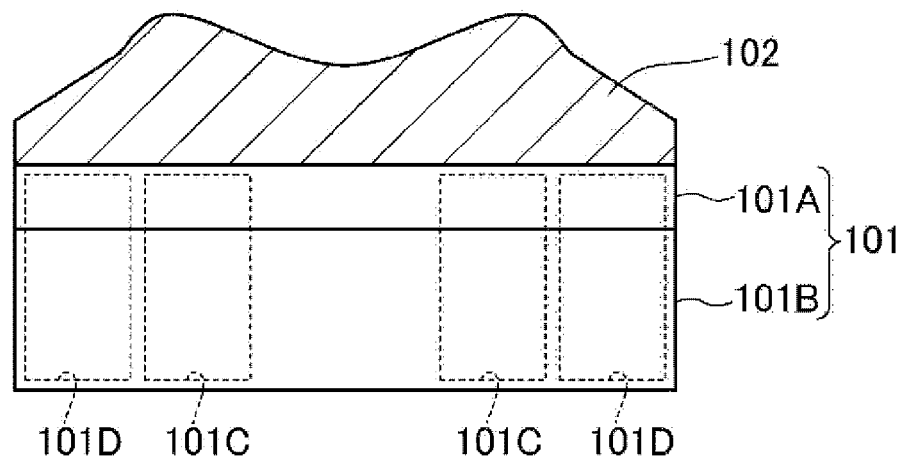
FIG. 5 is a sectional view of a nitride semiconductor structure according to a second modified example of the first exemplary embodiment.

FIG. 5 is a sectional view of a nitride semiconductor structure according to a third modified example of the first exemplary embodiment.

The nitride semiconductor structure according to the present modified example is different from the first exemplary embodiment not only in oxygen concentration distribution in semiconductor substrate 101 but also in thickness distribution of epitaxial layer 102. Specifically, oxygen concentration in an end portion of semiconductor substrate 101 is lower than that in a portion adjacent to the end portion of semiconductor substrate 101. More specifically, as shown in FIG. 5, low-oxygen-concentration region 101D is located at the end portion of semiconductor substrate 101, and high-oxygen-concentration region 101C is located at the portion adjacent to low-oxygen-concentration region 101D. It is also preferred that epitaxial layer 102 is formed to be thin at the end portion and to be thick at the portion adjacent to the end portion. More specifically, as shown in FIG. 5, it is preferred that epitaxial layer 102 is formed to have small thickness above low-oxygen-concentration region 101D and to have large thickness above high-oxygen-concentration region 101C.

A region of high oxygen concentration and a region of low oxygen concentration may be formed inside semiconductor substrate 101 by heating treatment or some other. It is therefore preferred that crystal growing conditions are varied in accordance with the distribution of the oxygen concentration to control the thickness distribution of epitaxial layer 102. Specifically, epitaxial layer 102 is formed to have large thickness at a portion just above high-oxygen-concentration region 101C and to have small thickness at a portion just above low-oxygen-concentration region 101D. In the case of using, for example, MOCVD, the thickness distribution can be controlled by adjusting flow rates of gases and a balance between the flow rates. High-oxygen-concentration region 101C of semiconductor substrate 101 has higher mechanical strength than low-oxygen-concentration region 101D. Consequently, there is an effect that the present nitride semiconductor structure can be restrained from being warped or cracked when epitaxial layer 102 having a thickness distribution as shown in FIG. 5 is formed.

As described above, a device, such as a transistor or diode, produced by using the nitride semiconductor structure of the present modified example can be improved in switching property. Additionally, the product yield can be heightened.

<Description of Transistor Structure>

Figure 6:
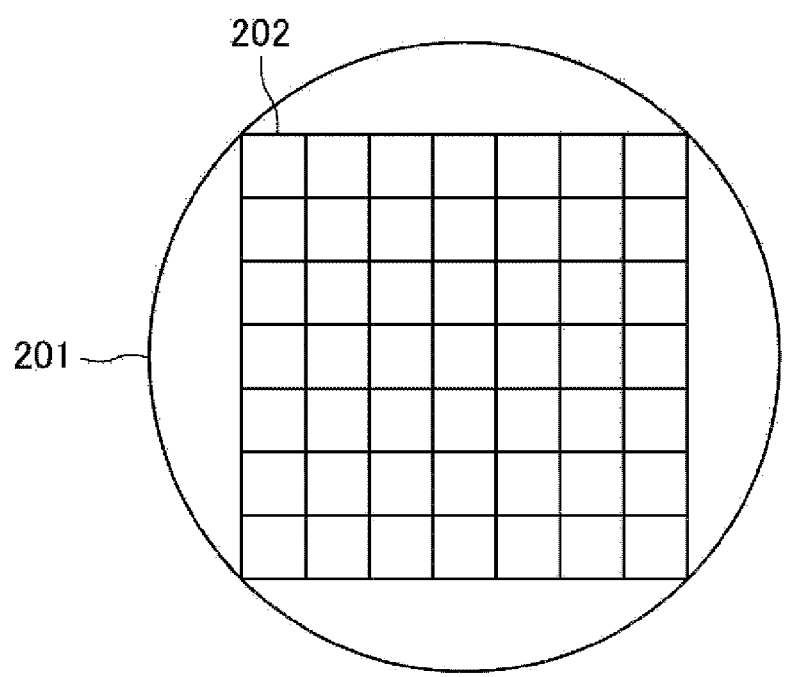
FIG. 6 is a plan view of a semiconductor wafer having a plurality of devices each produced using the nitride semiconductor structure according to the first exemplary embodiment.
Figure 7:
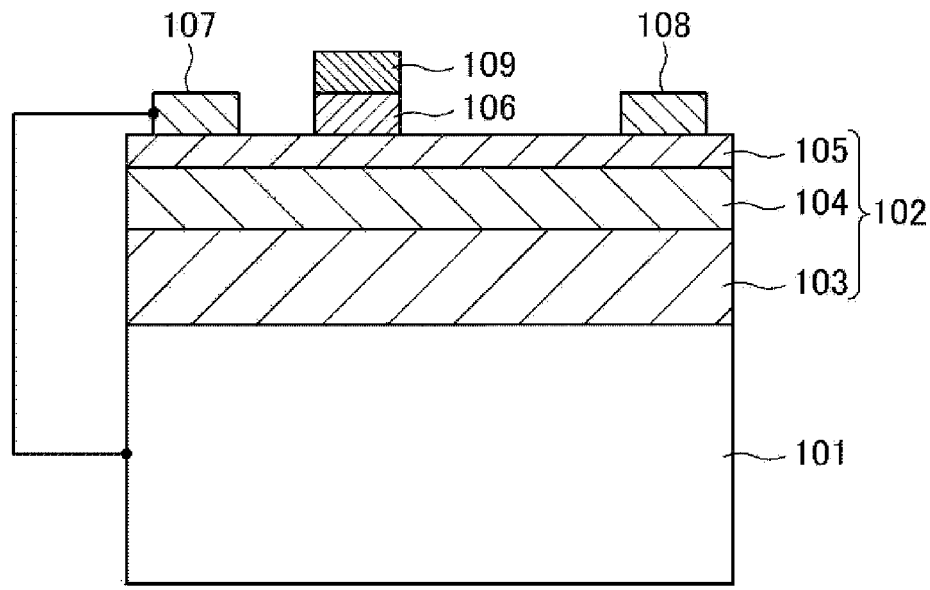
FIG. 7 is a sectional view of transistors obtained by dividing the semiconductor wafer.

Next, with reference to FIGS. 6 and 7, transistors produced by using the nitride semiconductor structure according to the first exemplary embodiment is described.

FIG. 6 is a plan view of semiconductor wafer 201 having a plurality of devices 202, such as transistors, produced by using the nitride semiconductor structure according to the first exemplary embodiment. FIG. 7 is a sectional view of one of the transistors yielded by dividing semiconductor wafer 201.

As shown in FIG. 7, epitaxial layer 102 comprises buffer layer 103, channel layer 104 formed on buffer layer 103, and barrier layer 105 formed on channel layer 104 and having larger bandgap energy than channel layer 104. Buffer layer 103 preferably comprises an AlN layer having a thickness of, for example, 300 nm and a superlattice layer that is an AlN/GaN periodic multilayered film having a total thickness of 2 µm. Channel layer 104 is preferably an undoped GaN layer having a thickness of, for example, 2 µm. Barrier layer 105 is preferably an undoped AlGaN layer having, for example, an Al proportion of 20% and a thickness of 20 nm. At this time, the thickness of epitaxial layer 102 is 4320 nm. As the thickness of epitaxial layer 102 is larger, a better result is obtained for the following reason: as the thickness of epitaxial layer 102 is larger, epitaxial layer 102 has lower electric field strength.

Buffer layer 103 preferably contains carbon. In particular, the concentration of carbon contained in buffer layer 103 is preferably from $1 \times 10^{18}$ cm$^{-3}$ to $1 \times 10^{20}$ cm$^{-3}$ both inclusive, and is more preferably $1 \times 10^{19}$ cm$^{-3}$ or more. When buffer layer 103 contains carbon, there is an effect that carriers remaining in buffer layer 103 can be decreased. However, if the carbon concentration is more than $1 \times 10^{20}$ cm$^{-3}$, the crystallinity of epitaxial layer 102 is deteriorated. Thus, the carbon concentration is preferably $1 \times 10^{20}$ cm$^{-3}$ or less.

Moreover, channel layer 104 preferably contains carbon. It is particularly preferred that channel layer 104 contains carbon and the concentration of carbon therein is $1 \times 10^{18}$ cm$^{-3}$ or less. When the carbon concentration in channel layer 104 is $1 \times 10^{18}$ cm$^{-3}$ or less, trapped-carrier density in channel layer 104 can be decreased so that the present nitride semiconductor structure can gain a good switching property. As the carbon concentration in channel layer 104 is lower, the switching property becomes better.

On barrier layer 105, for example, source electrode 107 and drain electrode 108 each made of, for example, Ti/Al are formed. Between source electrode 107 and drain electrode 108, p-type semiconductor layer (semiconductor layer containing p-type impurity) 106 is selectively formed, which is, for example, a p-type GaN layer having a thickness of 100 nm. On p-type semiconductor layer 106, gate electrode 109 made of, for example, Ni/Au is formed. Using the structure described above, it is possible that a two-dimensional electron gas of high concentration is produced at an interface between channel layer 104 and barrier layer 105, so that the present transistor can have large electric current therein and low on-resistance.

Since p-type semiconductor layer 106 is located under gate electrode 109, energy potential at the interface between channel layer 104 and barrier layer 105 is raised, so that the so-called normally-off operation is realized, which is an operation that no drain current flows even when the gate voltage is 0 V.

It is preferred that source electrode 107 is electrically connected to semiconductor substrate 101. Thus, the electrical potential of semiconductor substrate 101 becomes stable. Instead of the electrical connection between source electrode 107 and semiconductor substrate 101, drain electrode 108 may be electrically connected to semiconductor substrate 101. By restraining the group III element from diffusing into semiconductor substrate 101, the width of a depletion layer in semiconductor substrate 101 becomes large, so that the depletion layer can keep a large voltage. For this reason, voltage distribution in epitaxial layer 102 can be decreased, so that the electric field strength inside epitaxial layer 102 can be decreased. By making the oxygen concentration in semiconductor substrate 101 set into the range of $1 \times 10^{17}$ cm$^{-3}$ to $5 \times 10^{18}$ cm$^{-3}$, the thickness of epitaxial layer 102 can be large, so that the electric field strength inside epitaxial layer 102 can be decreased. In this way, the transistor can be restrained from undergoing current collapse and gains a good switching property.

A gate electrode may be formed which makes Schottky junction to barrier layer 105 without interposing p-type semiconductor layer 106 between the two. A gate insulating film may be used instead of p-type semiconductor layer 106.

<About Transistor Characteristics>

Figure 8:
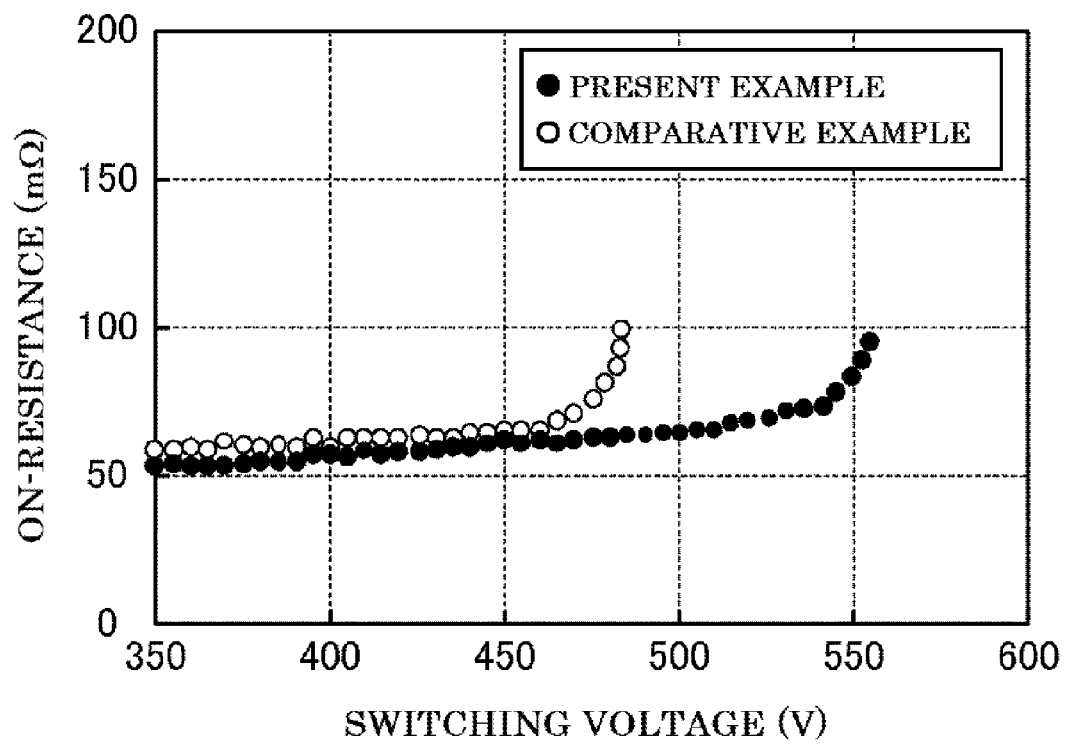
FIG. 8 is a graph showing evaluation results of respective switching properties of transistors.

The following is the description of the switching property of the transistor. FIG. 8 is a graph showing evaluation results of respective switching properties of transistors. The results in FIG. 8 are each a result obtained by making a switching evaluation while the drain voltage (switching voltage) is varied under following condition. The condition is applying a pulsed gate-voltage continuously to the transistor, which has an off-period of 10 msec. and an on-period of 1 msec.

One of the results shown in FIG. 8 is a switching evaluation result of a transistor produced as the present example by using the nitride semiconductor structure according to the first exemplary embodiment. The other shown in FIG. 8 is a switching evaluation result of a transistor as a comparative example in which a group III element of a high concentration has diffused into semiconductor substrate 101.

In the transistor of the present example, the resistance thereof when the transistor is in an on-state (on-resistance) does not increase until the drain voltage (switching voltage) reaches 550 V. Thus, the transistor shows a good switching property. By contrast, in the transistor of the comparative example, the on-resistance thereof rises when the drain voltage (switching voltage) reaches 475 V. Thus, it is understood that the transistor of the comparative example is poorer in switching property than the transistor of the present example.

It is understood from this matter that any transistor produced using the nitride semiconductor structure according to the present disclosure is superior in improvement for switching property.

Herein, in the present example, a distribution of elements existed near the interface between semiconductor substrate 101, which is a silicon substrate, and buffer layer 103 (buffer layer 103 includes an AlN layer) has been checked. As shown in FIG. 9, using secondary ion mass spectrometry (SIMS), the elements existed near the interface between semiconductor substrate 101 and buffer layer 103 have been analyzed.

As shown in FIG. 9, it is understood that Al, which is a group III element, diffuses from a surface of the semiconductor substrate into the semiconductor substrate by a depth of about 100 nm (in other words, the diffusion distance of Al is about 100 nm). In this way, the diffusion of Al, which is a group III element, can be restrained. Thus, a depletion layer would be able to extend to the inside of the semiconductor substrate. As a result, it appears that a sufficiently large voltage is distributed into the semiconductor substrate to decrease electric field strength inside the epitaxial layer, so that the transistor is restrained from undergoing current collapse.

FIG. 9 is merely one example of the evaluation analyzing the distribution of the elements in a depth direction. Thus, the evaluation may be made using a different analyzing method.

<Description of Diode Structure>

Figure 10:
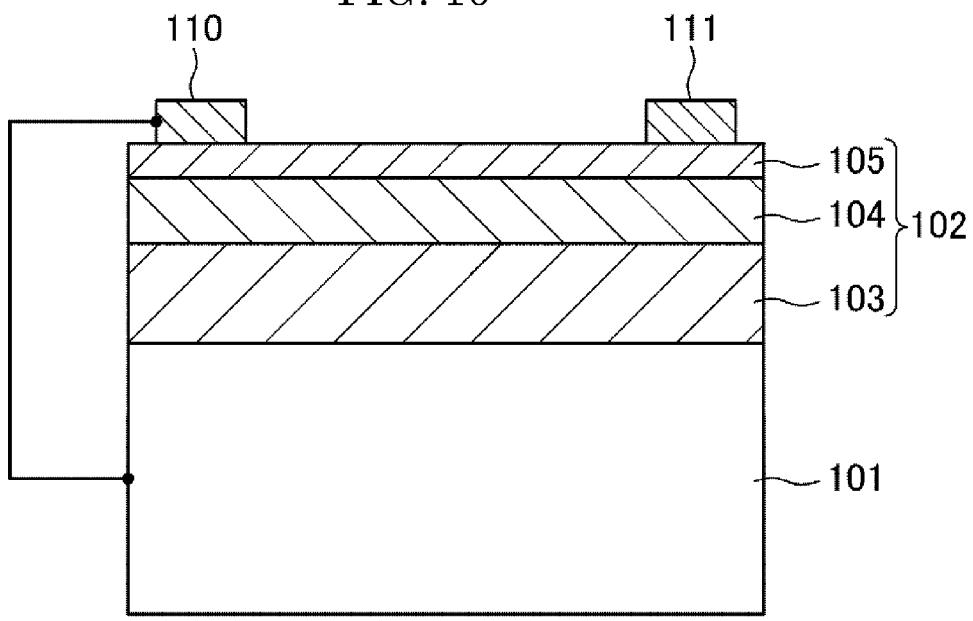
FIG. 10 is a sectional view of a diode obtained by dividing the semiconductor wafer.

Referring to FIGS. 6 and 10, a diode produced using the nitride semiconductor structure according to the first exemplary embodiment is described.

FIG. 6 is a plan view of semiconductor wafer 201 having a plurality of devices 202, such as diodes, produced using the nitride semiconductor structure according to the first exemplary embodiment. FIG. 10 is a sectional view of a diode obtained by dividing semiconductor wafer 201.

The layer structure and materials of epitaxial layer 102 shown in FIG. 10, and others thereof are the same as those of epitaxial layer 102 in the above-mentioned transistor. Thus, description of the layer structure and so on is omitted.

As shown in FIG. 10, positive electrode 110 made of, for example, Ni/Au, and negative electrode 111 made of Ti/Al are formed on barrier layer 105 which constitutes epitaxial layer 102. Using the structure described above, it is possible that a two-dimensional electron gas of high concentration is produced at an interface between channel layer 104 and barrier layer 105, so that the present diode can have large electric current therein and low on-resistance.

It is preferred that positive electrode 110 is electrically connected to semiconductor substrate 101. Instead of the electrical connection between positive electrode 110 and semiconductor substrate 101, negative electrode 111 may be connected to semiconductor substrate 101. In the same manner as in the case of the transistor, there is an effect that the electrical potential of semiconductor substrate 101 becomes stable by producing the electrical connection between positive electrode 110 and semiconductor substrate 101. Moreover, in the same manner as in the case of the transistor, there is an effect that the group III element is restrained from diffusing into semiconductor substrate 101 by producing the electrical connection between negative electrode 111 and semiconductor substrate 101.

The diode may be made into a PN junction type or a PIN type.

Nitride semiconductor structures may each be structured by combining two or more selected appropriately from the first exemplary embodiment of the present invention and the first to third modified examples thereof as far as the combination is consistent with the scope of the present disclosure. Using these nitride semiconductor structures, a device such as a transistor may be produced.

About the materials and the numerical values disclosed in the present description, preferred materials and numerical values have been described. Thus, materials and numerical values usable in the present disclosure are not necessarily limited to these materials and numerical values.

What is claimed is:

1. A nitride semiconductor structure comprising:
a semiconductor substrate, and
a layer formed over the semiconductor substrate and comprising plural nitride semiconductor layers,
wherein the semiconductor substrate has, from a side thereof near the layer comprising the plural nitride semiconductor layers, a surface region and an internal region in this order,
the surface region has a resistivity of 0.1 Ωcm or more, and the internal region has a resistivity of 1000 Ωcm or more, and
a central portion of the semiconductor substrate has an oxygen concentration higher than that of an end portion of the semiconductor substrate.

2. The nitride semiconductor structure according to claim 1, wherein the semiconductor substrate has an oxygen concentration ranging from $1 \times 10^{17}$ cm$^{-3}$ to $5 \times 10^{18}$ cm$^{-3}$ both inclusive.

3. A nitride semiconductor structure comprising:
a semiconductor substrate, and
a layer formed over the semiconductor substrate and comprising plural nitride semiconductor layers,
wherein the semiconductor substrate has, from a side thereof near the layer comprising the plural nitride semiconductor layers, a surface region and an internal region in this order,
the surface region has a resistivity of 0.1 Ωcm or more, and the internal region has a resistivity of 1000 Ωcm or more, and
the semiconductor substrate has an oxygen concentration distribution, and a thickness of the layer comprising the plural nitride semiconductor layers above a high-oxygen concentration region of the semiconductor substrate is larger than a thickness of the layer comprising the plural nitride semiconductor layers above a low-oxygen concentration region of the semiconductor substrate.

4. A nitride semiconductor structure comprising:
a semiconductor substrate, and
a layer formed over the semiconductor substrate and comprising plural nitride semiconductor layers,
wherein the semiconductor substrate has, from a side thereof near the layer comprising the plural nitride semiconductor layers, a surface region and an internal region in this order,
the surface region has a resistivity of 0.1 Ωcm or more, and the internal region has a resistivity of 1000 Ωcm or more, and
the surface region has a lower oxygen concentration than the internal region.

5. The nitride semiconductor structure according to claim 1, wherein the layer comprising the plural nitride semiconductor layers has a thickness of 1000 nm or more.

6. The nitride semiconductor structure according to claim 1, wherein a source electrode, a drain electrode, and a gate electrode are formed on the layer comprising the plural nitride semiconductor layers.

7. The nitride semiconductor structure according to claim 6, wherein a semiconductor layer containing a p-type impurity is formed between the gate electrode and the layer comprising the plural nitride semiconductor layers.

8. The nitride semiconductor structure according to claim 6, wherein the semiconductor substrate is electrically connected to the source electrode or the drain electrode.

9. The nitride semiconductor structure according to claim 1, wherein a positive electrode and a negative electrode are formed on the layer comprising the plural nitride semiconductor layers.

10. The nitride semiconductor structure according to claim 9, wherein the semiconductor substrate is electrically connected to the positive electrode or the negative electrode.

11. The nitride semiconductor structure according to claim 1, wherein the layer comprising the plural nitride semiconductor layers comprises a buffer layer, a channel layer formed over the buffer layer, and a barrier layer formed over the channel layer and having a larger bandgap energy than the channel layer.

12. The nitride semiconductor structure according to claim 11, wherein the buffer layer comprises carbon.

13. The nitride semiconductor structure according to claim 12, wherein the carbon comprised in the buffer layer has a concentration ranging from $1 \times 10^{18}$ cm$^{-3}$ to $1 \times 10^{20}$ cm$^{-3}$ both inclusive.

14. The nitride semiconductor structure according to claim 11, wherein the channel layer comprises carbon.

15. The nitride semiconductor structure according to claim 14, wherein the carbon comprised in the channel layer has a concentration of $1 \times 10^{18}$ cm$^{-3}$ or less.

* * * * *